United States Patent
Ma et al.

(10) Patent No.: US 6,816,035 B2
(45) Date of Patent: Nov. 9, 2004

(54) FORMING FILM BULK ACOUSTIC RESONATOR FILTERS

(75) Inventors: Qing Ma, San Jose, CA (US); Li-Peng Wang, Santa Clara, CA (US); Valluri Rao, Saratoga, CA (US)

(73) Assignee: Intel Corporation, Santa Clara, CA (US)

(*) Notice: Subject to any disclaimer, the term of this patent is extended or adjusted under 35 U.S.C. 154(b) by 182 days.

(21) Appl. No.: 10/214,493

(22) Filed: Aug. 8, 2002

(65) Prior Publication Data

US 2004/0027216 A1 Feb. 12, 2004

(51) Int. Cl.⁷ ................................................ H03H 9/00
(52) U.S. Cl. .................... 333/187; 333/186; 333/192; 310/322; 29/25.35
(58) Field of Search ................. 333/186–192; 310/322, 349; 29/25.35

(56) References Cited

U.S. PATENT DOCUMENTS

| | | | | |
|---|---|---|---|---|
| 4,456,850 A | * | 6/1984 | Inoue et al. | 310/324 |
| 5,075,641 A | * | 12/1991 | Weber et al. | 331/108 C |
| 5,666,706 A | * | 9/1997 | Tomita et al. | 29/25.35 |
| 5,692,279 A | * | 12/1997 | Mang et al. | 29/25.35 |
| 6,349,454 B1 | * | 2/2002 | Manfra et al. | 29/25.35 |
| 6,441,539 B1 | * | 8/2002 | Kitamura et al. | 310/346 |
| 6,617,751 B2 | * | 9/2003 | Sunwoo et al. | 310/312 |
| 6,662,419 B2 | * | 12/2003 | Wang et al. | 29/25.35 |

* cited by examiner

Primary Examiner—Michael Tokar
Assistant Examiner—Khai Nguyen
(74) Attorney, Agent, or Firm—Trop, Pruner & Hu, P.C.

(57) ABSTRACT

A film bulk acoustic resonator may be formed with a piezoelectric film having improved quality. The piezoelectric film may be deposited directly onto a single crystal silicon substrate. That substrate may be removed and selectively replaced with a lower electrode to form the film bulk acoustic resonator.

18 Claims, 17 Drawing Sheets

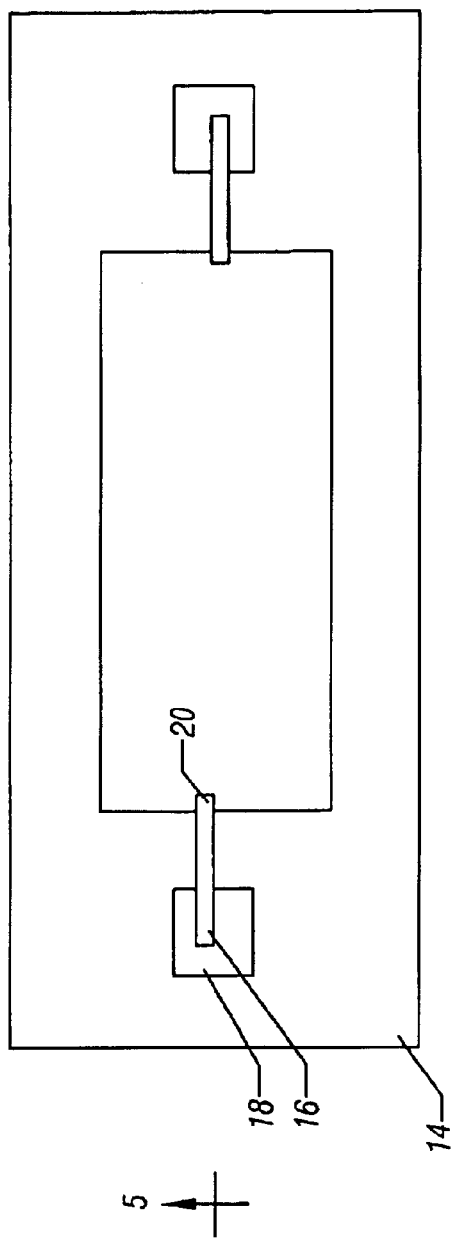
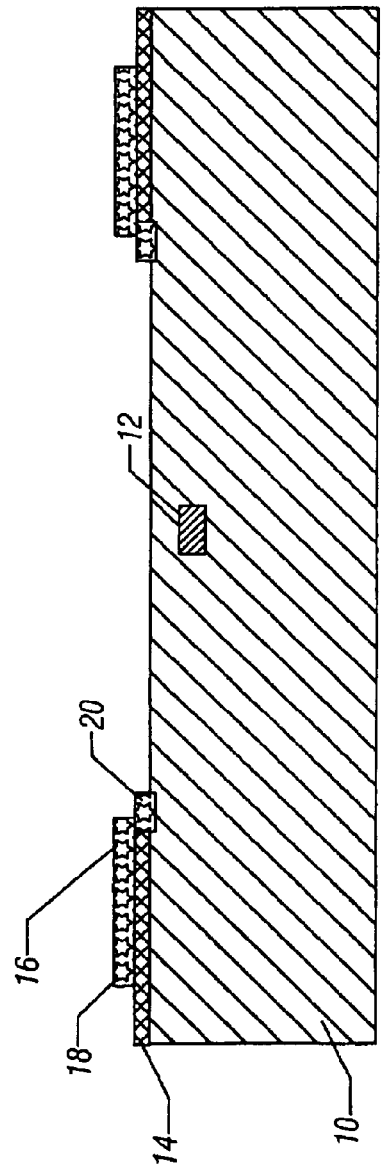
FIG. 4
FIG. 5

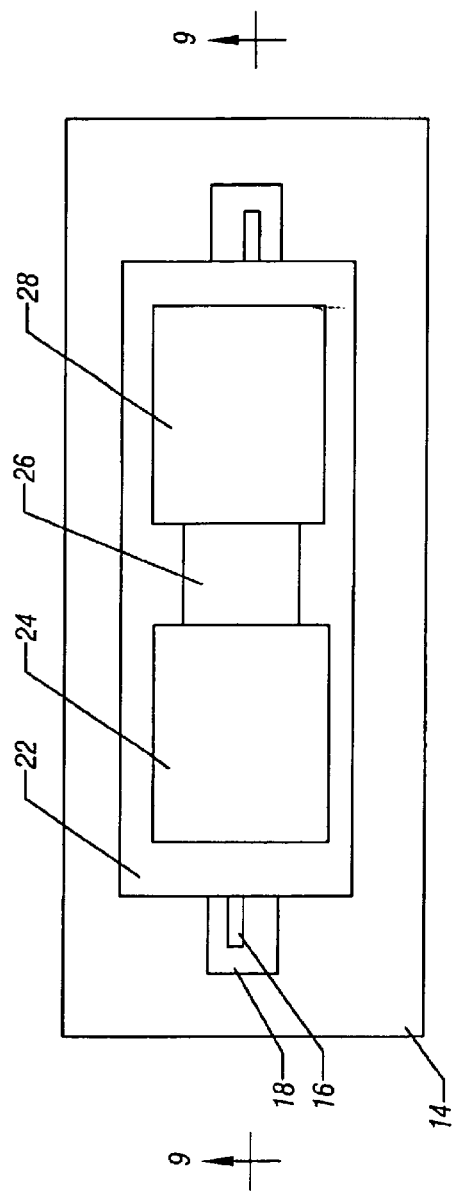
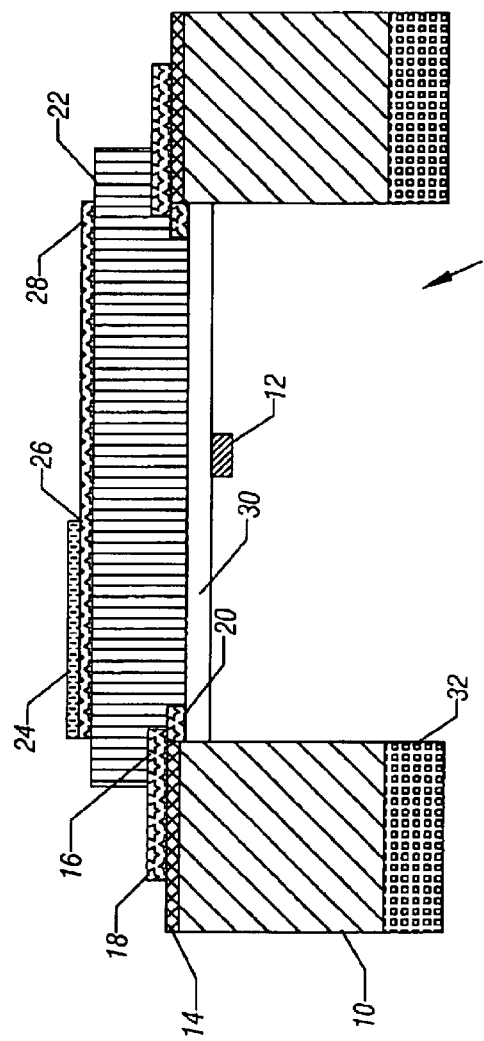
FIG. 8
FIG. 9

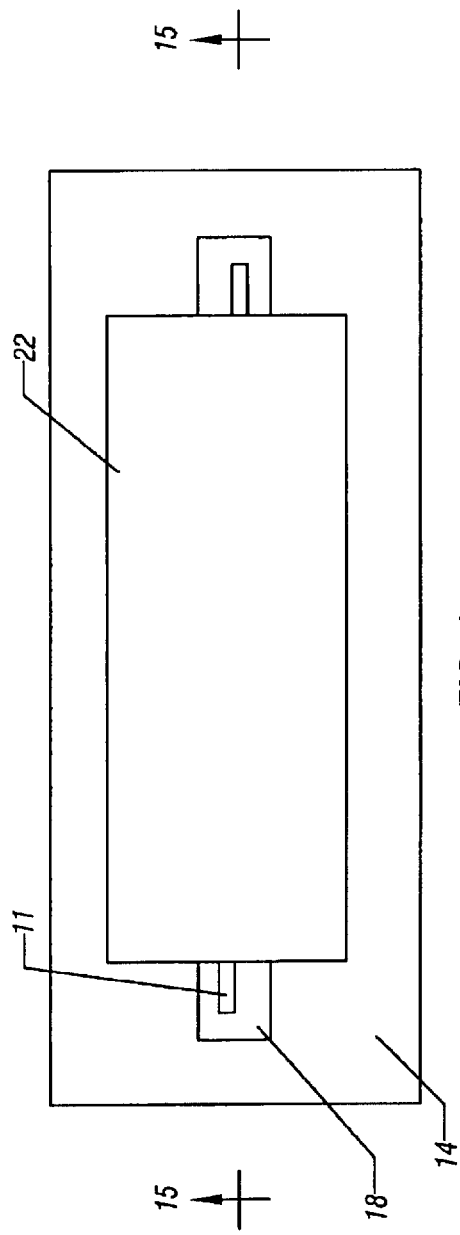
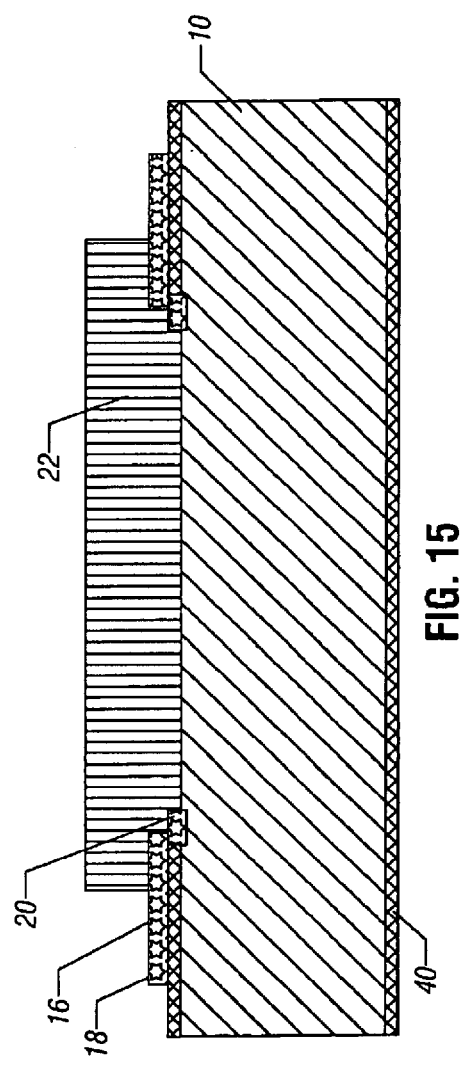
FIG. 14
FIG. 15

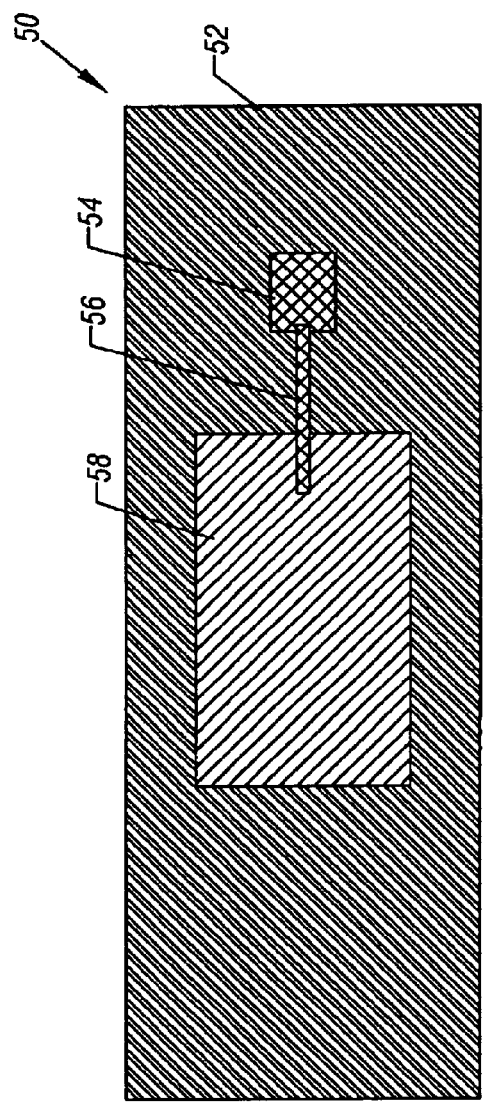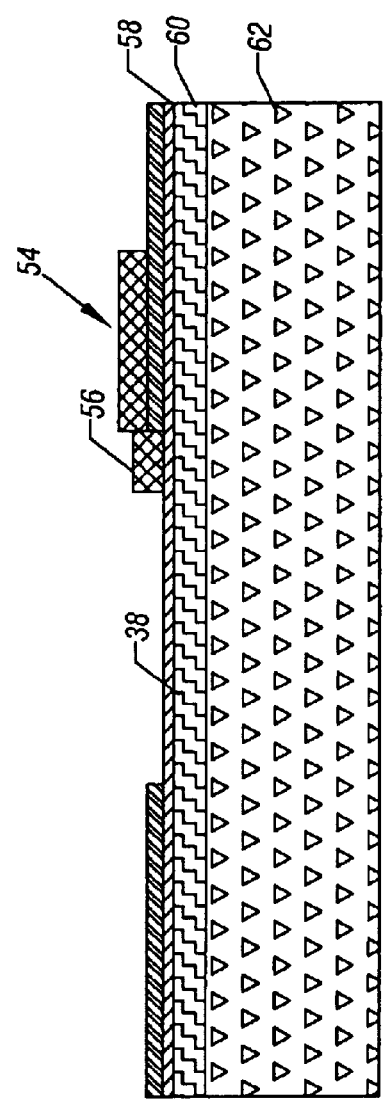

FORMING FILM BULK ACOUSTIC RESONATOR FILTERS

BACKGROUND

This invention relates generally to the fabrication of film bulk acoustic resonator filters.

Radio frequency front-end filters may include film bulk acoustic resonators (FBARs) having many advantages compared to other technologies such as surface acoustic wave (SAW) devices and ceramic filters, particularly at relatively high frequencies. For example, SAW filters start to have excessive insertion loss above 2.4 gigahertz and ceramic filters are much larger in size and become increasingly difficult to fabricate as frequency increases.

Film bulk acoustic resonators include an upper electrode and a lower electrode that sandwich a piezoelectric film such as ZnO or AlN. The material properties of these films, including their longitudinal piezoelectric coefficient and acoustic loss coefficient, are the key parameters for the resonator's performance, such as the electric/mechanical coupling, and quality (Q) factor. High quality factors of film bulk acoustic resonators improve their insertion loss and pass-to-stop band roll-off. High electromechanical coupling of film bulk acoustic resonators improves the bandwidth of the filter.

Thus, there is a need for better ways to improve the properties of film bulk acoustic resonators.

BRIEF DESCRIPTION OF THE DRAWINGS

FIG. 4 is a top plan view of a subsequent stage in the manufacture of the film bulk acoustic resonator in accordance with one embodiment of the present invention;

FIG. 5 is a cross-sectional view taken generally along the line of 5—5 in FIG. 4;

FIG. 8 is an enlarged top plan view of a subsequent stage of manufacture in accordance with one embodiment of the present invention;

FIG. 9 is a cross-sectional view taken generally along the line 9—9 in FIG. 8;

FIG. 14 is an enlarged top plan view of a subsequent stage of manufacture in accordance with one embodiment of the present invention;

FIG. 15 is a cross-sectional view taken generally along the line 15—15 in FIG. 14;

FIG. 19 is an enlarged, top plan view of another embodiment of the present invention;

FIG. 20 is a cross-sectional view taken centrally through the embodiment shown in FIG. 19;

DETAILED DESCRIPTION

Figure 1:
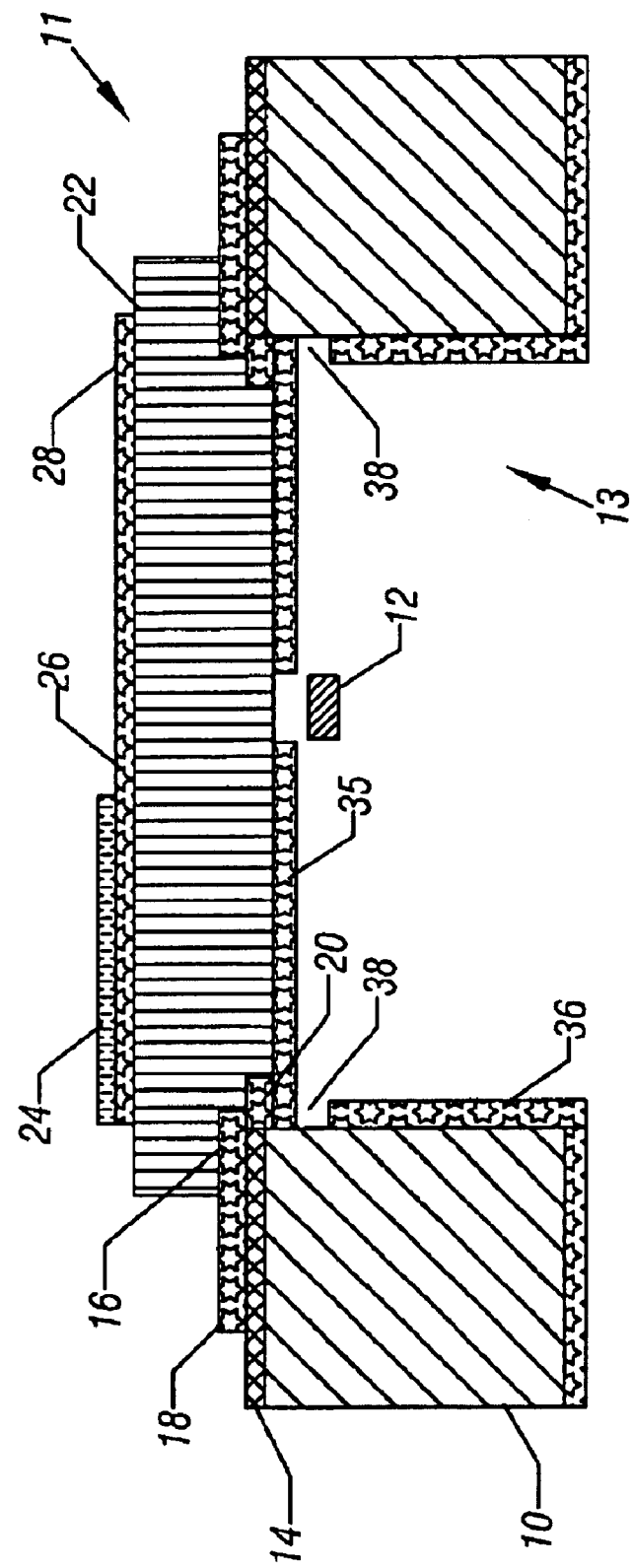
FIG. 1 is an enlarged cross-sectional view of a film bulk acoustic resonator in accordance with one embodiment of the present invention.

Referring to FIG. 1, a film bulk acoustic resonator (FBAR) may be formed over a silicon substrate 10 having a backside cavity 13 formed therein. The resonator 11 may include an upper electrode structure including a layer 24, a layer 26, a portion 28, and a lower electrode structure 35. Above the lower electrode structure 35 is a piezoelectric film 22. The piezoelectric film 22 may be coupled to a contact pad 18 through an electrode portion 16 and an electrode portion 20 that also connects to the lower electrode 35. A gap 38 is defined between the lower electrode 35 and an electrode 36.

In accordance with one embodiment of the present invention, the piezoelectric film 22 may advantageously be directly deposited initially onto the silicon substrate 10. The inventors of the present application have determined that by initially depositing the piezoelectric layer 22 directly on a silicon substrate 10, the quality of the resulting film is greatly improved. Thereafter, the underlying portion of the silicon substrate 10 may be removed to position an appropriate electrode 35. Thus, a film bulk acoustic resonator 11 may be generated which has a lower electrode 35 at the appropriate location and has an improved piezoelectric layer 22 because that layer was initially deposited directly onto a silicon substrate 10.

Figure 2:
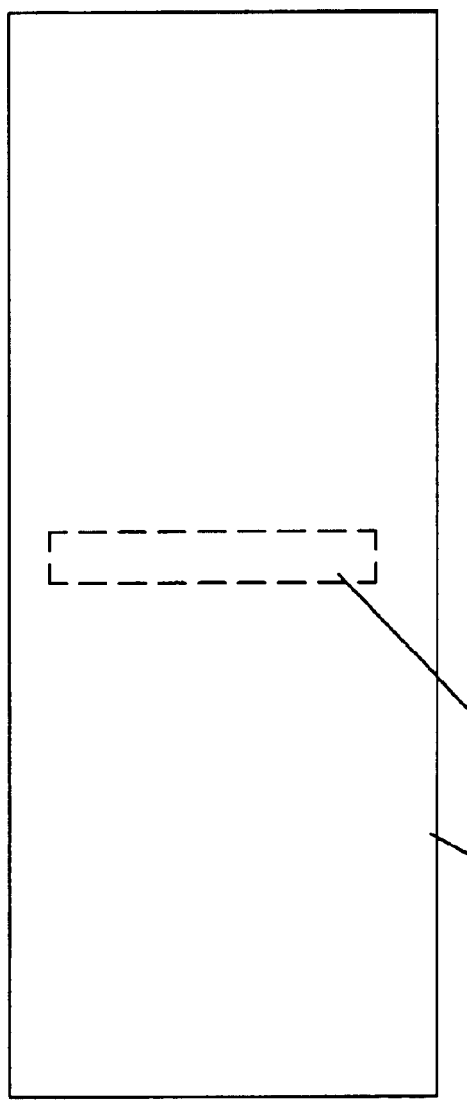
FIG. 2 is a top plan view of an early stage of manufacture of the resonators shown in FIG. 1 in accordance with one embodiment of the present invention.

Referring to FIG. 2, a high resistivity silicon wafer 10 may be used as a starting material to reduce electromagnetic coupling. An ion implant of oxygen may be followed by rapid thermal anneal to activate the doping. A buried mask layer 12 is formed by the implant to separate the bottom electrode of the film bulk acoustic resonator in a fashion that will be described in greater detail later. The width of the separation mask may be designed to be relatively small, for example 20 micrometers.

Therefore, the film bulk acoustic resonators can be close packed and losses due to interactions can be reduced in some embodiments. In addition, the buried mask layer 12 may be designed to discontinue the bottom metal from the device area to the substrate. Therefore, parasitic capacitances can be reduced as will be explained in more detail hereinafter.

Figure 3:
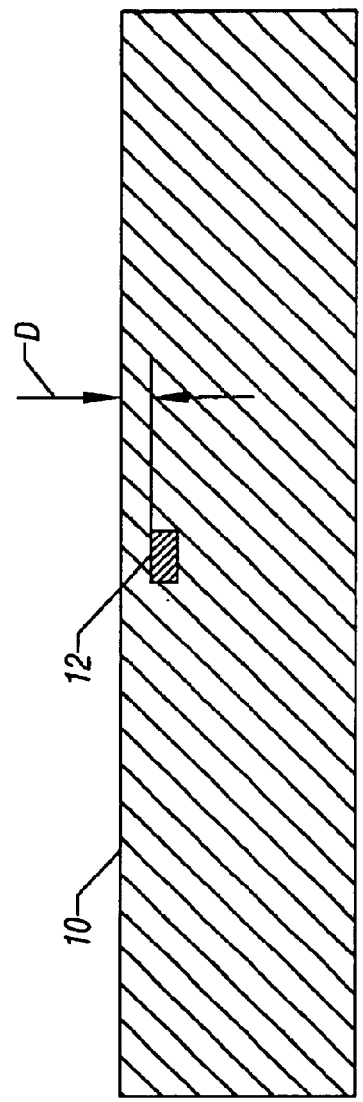
FIG. 3 is a cross-sectional view taken generally along the line 3—3 in FIG. 2.

Thus, as shown in FIG. 3, the buried mask layer 12 may be formed a distance D below the surface of the high resistivity silicon wafer 10. The distance D may, for example, be approximately 3 micrometers in one embodiment of the present invention. The shape of the buried mask layer 12 can be variable while an elongate structure is shown as an example in FIGS. 2 and 3.

Turning next to FIGS. 4 and 5, a dielectric layer 14 may be formed on the upper surface of the substrate 10. The dielectric layer 14 may be used in some embodiments for isolation or prevention of metal reaction with the substrate 10. In one embodiment the dielectric layer 14 may be deposited and patterned to have a central opening. A metal layer, including the portions 16 and 18, may be deposited and patterned for later bottom electrode contact. The metal layer may include a portion 20 that forms a buried metal trace in one embodiment of the present invention.

Figure 6:
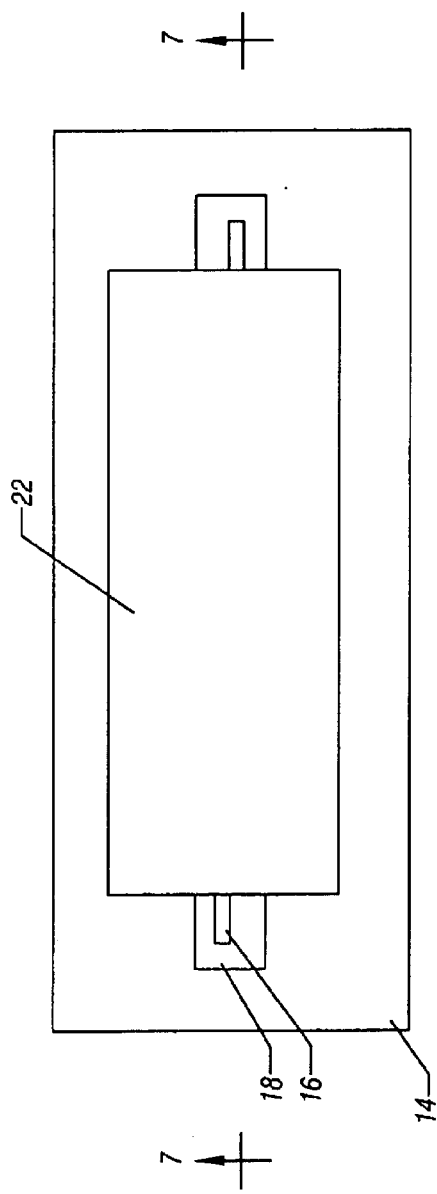
FIG. 6 is an enlarged top plan view of a subsequent stage of manufacture in accordance with one embodiment of the present invention.
Figure 7:
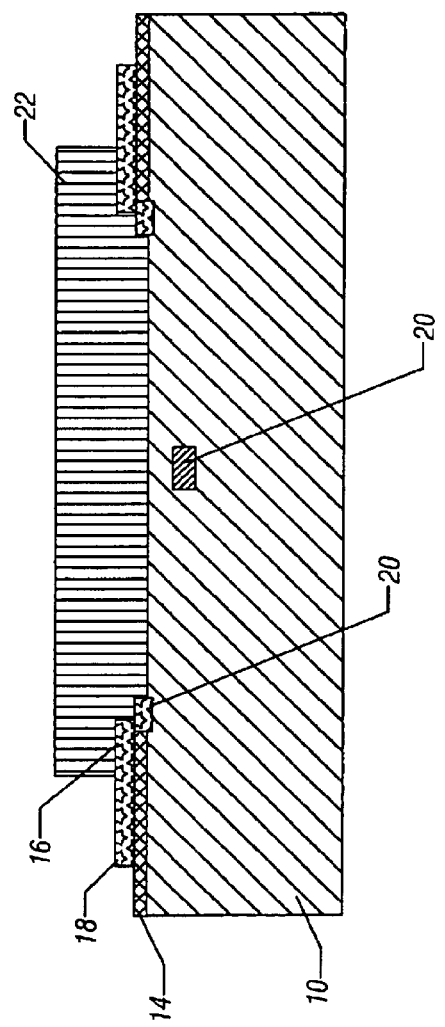
FIG. 7 is a cross-sectional view taken generally along the line 7—7 in FIG. 6.

Turning now to FIGS. 6 and 7, a piezoelectric film 22 may be directly deposited onto the silicon substrate 10 to improve the quality of the deposited film 22. The film 22 may be patterned to a shape shown in FIGS. 6 and 7 in one embodiment.

Moving on to FIGS. 8 and 9, the top electrode portions 24, 26, and 28 may be deposited and patterned. A metal or a dielectric material layer, depending on the film bulk acoustic resonator filter processes, is deposited and patterned on the shunt film bulk acoustic resonators to have different frequency by the mass loading effect. Thus, the extent of the additional layer 24 may be controlled to produce the desired mass loading and, as a result, the desired frequency performance of the film bulk acoustic resonator.

As shown in FIG. 9, the backside cavity 13 is etched by deep reactive ion etching (DRIE), as one example, or crystal orientation-dependent anisotropic etching (CODA), as another example. The backside silicon is mostly etched down to the buried mask layer 12. This leaves a portion of the silicon substrate 30 between the buried mask layer 12 and the piezoelectric film 22.

Figure 10:
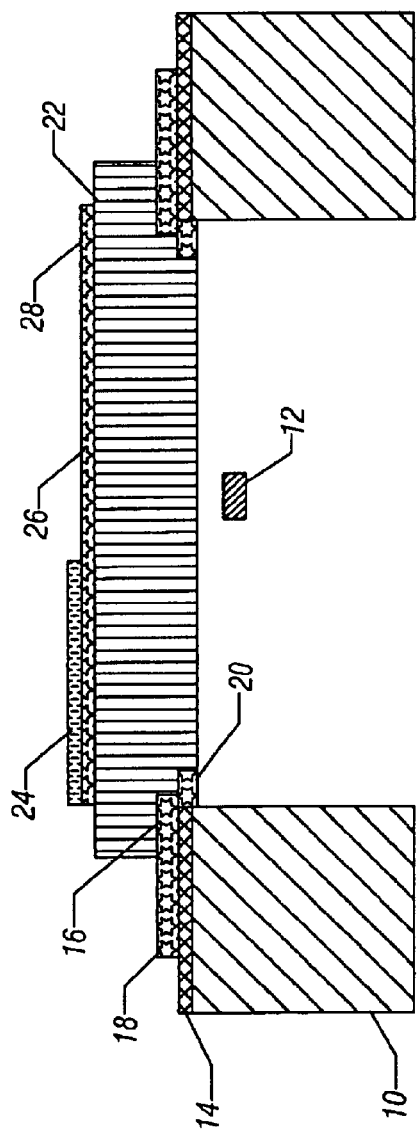
FIG. 10 is an enlarged cross-sectional view of a subsequent stage of manufacture in accordance with one embodiment of the present invention.

As shown in FIG. 10, silicon isotropy etching, such as $SF_6$ plasma, may be used to remove the remaining thin silicon portion 30 with an etch stop at the piezoelectric film 22 and to form the buried masking layer 12, as well. The photoresist 32 may be stripped. The buried mask layer 32 may be supported on its ends by the silicon substrate 10.

Turning to FIG. 1, the bottom electrode 35 is directionally deposited, for example using an electron beam evaporation technique, from the backside using the buried mask layer 12 as a masking layer. The bottom electrode 35 has connection to the pads 18 through the buried metal trace 20. The buried mask layer 12 discontinues the metal from the device to the substrate. Thus, a metal portion 36 is separated from the bottom electrode 35 by the gap 38.

Figure 11:
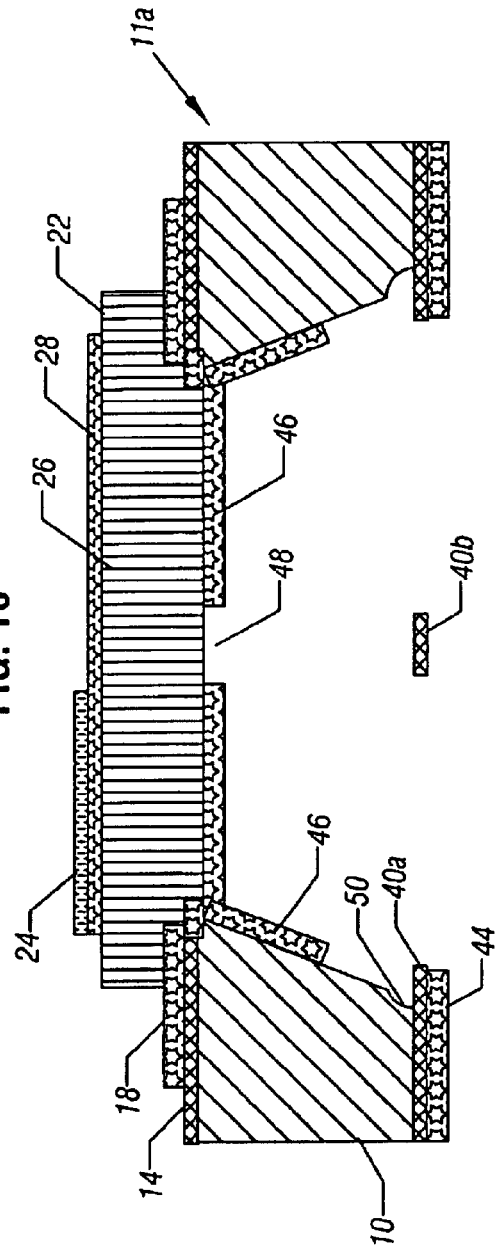
FIG. 11 is an enlarged cross-sectional view of another embodiment of a film bulk acoustic resonator in accordance with one embodiment of the present invention.

Referring to FIG. 11, a film bulk acoustic resonator 11a may be made by a different process in accordance with another embodiment of the present invention. The structure shown in FIG. 11 is similar in some respects to that shown in FIG. 1, except that a silicon substrate 10 has tapered sidewalls, has a mouse bite 50, and includes lower structures 40a and 44. The position of the masking layer 40b is somewhat different than that of the masking layer 12; however, the effect is similar as indicated at 48.

Figure 12:
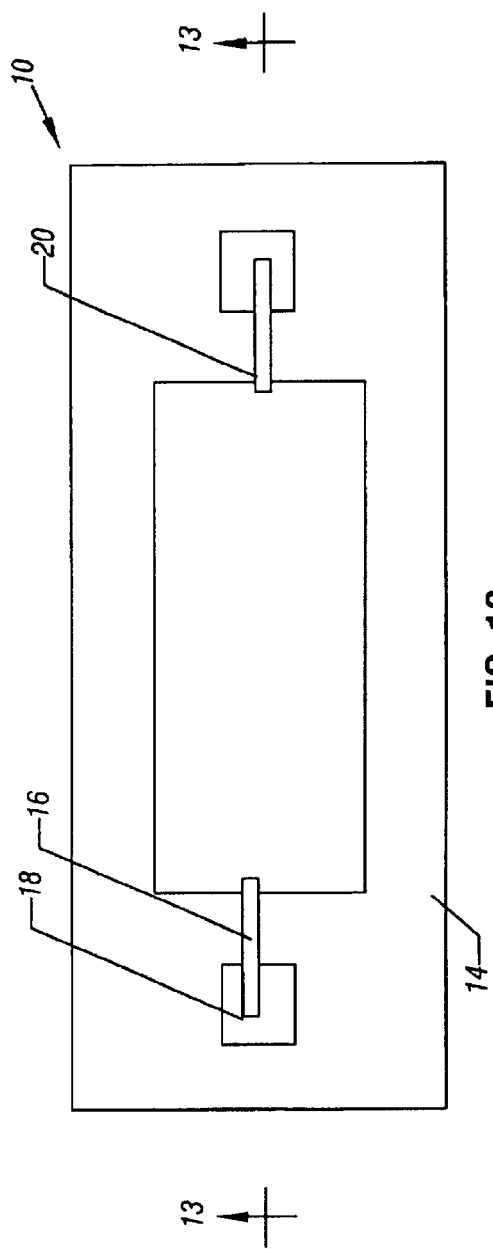
FIG. 12 is an enlarged top plan view of an early stage of manufacture of the structure shown in FIG. 11 in accordance with one embodiment of the present invention.
Figure 13:
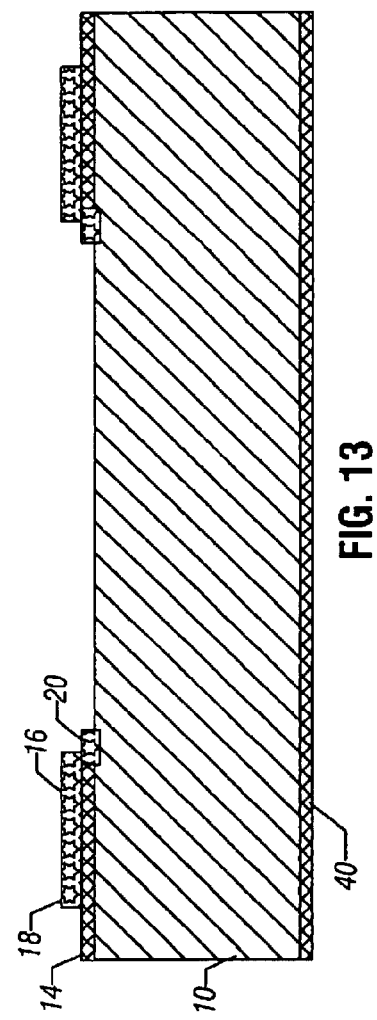
FIG. 13 is a cross-sectional view taken generally along the line 13—13 in FIG. 12 in accordance with one embodiment of the present invention.

The fabrication of the structure shown in FIG. 11 begins as shown in FIG. 12 with a high resistivity silicon wafer 10 that is used as a starting material to reduce electromagnetic coupling. The silicon nitride 14 is deposited as a hard mask for a backside cavity etching as shown in FIG. 13. The dielectric layer 14 may be formed as described previously as may be the pad 18 and the interconnect 16. Also the buried metal trace 20 may be formed as described previously.

Referring now to FIGS. 14 and 15, the piezoelectric film 22 is directly deposited on the single crystal silicon substrate 10 to improve its film quality. The deposited piezoelectric film may then be patterned as indicated in FIGS. 14 and 15.

Figure 16:
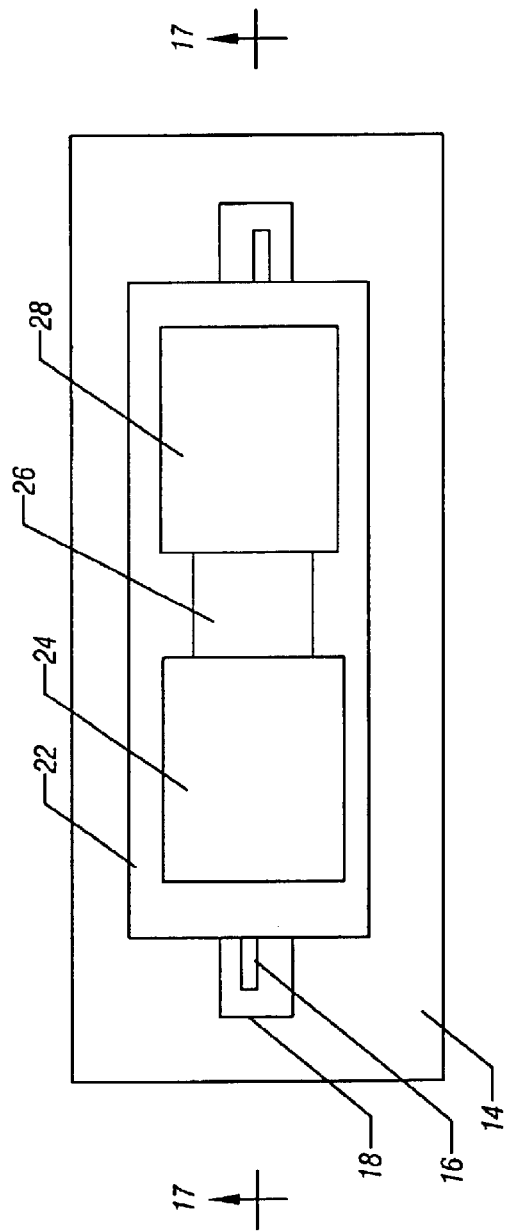
FIG. 16 is an enlarged top plan view of a subsequent stage of manufacture in accordance with one embodiment of the present invention.
Figure 17:
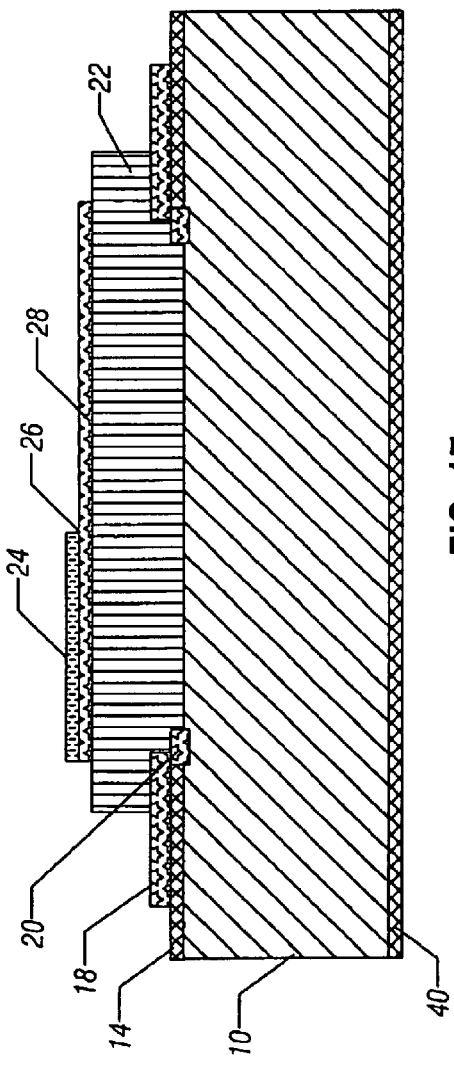
FIG. 17 is a cross-sectional view taken generally along the line 17—17 in FIG. 16.

As shown in FIGS. 16 and 17, the top electrode may include portions 24, 26, and 28. A metal or dielectric material, depending on the film bulk acoustic resonator filter processes, is deposited and patterned on the shunt film bulk acoustic resonators so that they have a different frequency through the mass loading effect.

Figure 18:
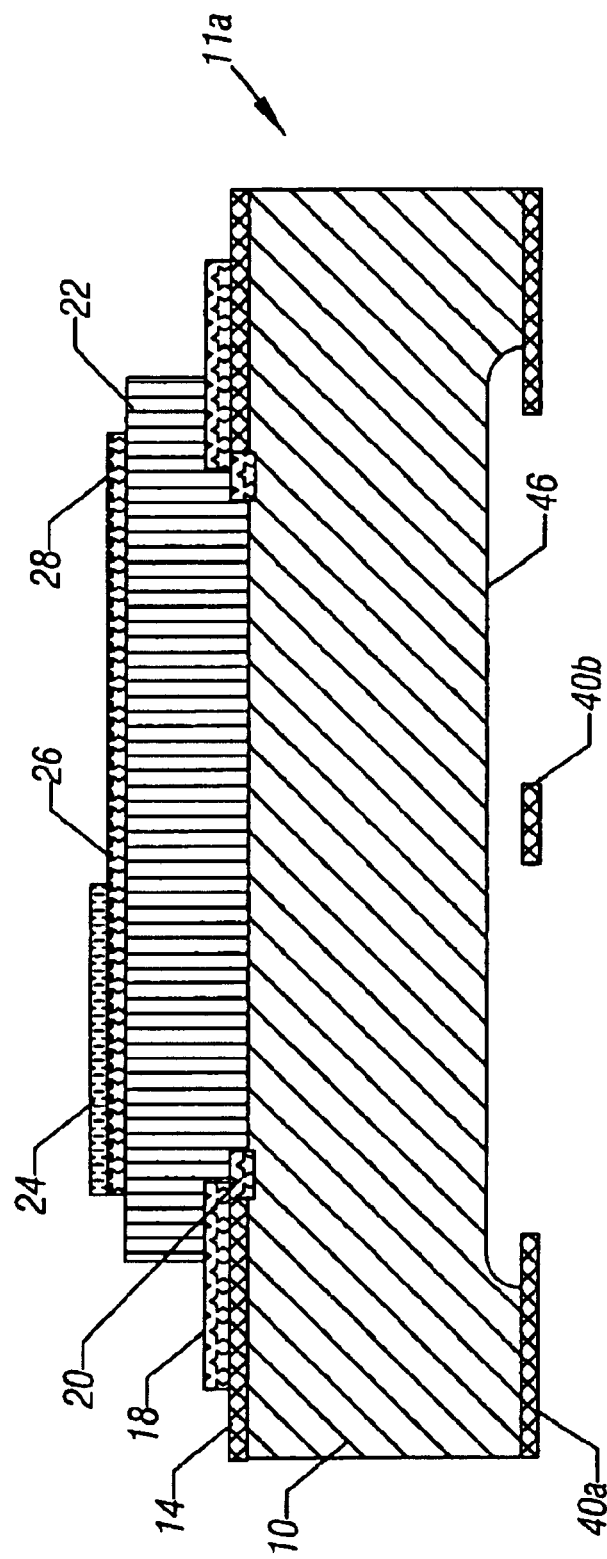
FIG. 18 is an enlarged cross-sectional view at a subsequent stage of manufacture in accordance with one embodiment of the present invention.

Referring to FIG. 18, the backside silicon nitride 40a is patterned to form a backside cavity 46 and a bottom electrode separation, silicon isotropic etching, such as $SF_6$ plasma, may be used to release the backside silicon nitride on the areas which are going to separate the bottom electrodes between the film bulk acoustic resonators and discontinue the device bottom electrode to the substrate metal. Thus, a masking layer 40b may be formed from the layer 40.

Then, referring to FIG. 11, the backside cavity is etched using CODA etching or DRIE, as two examples. The bottom electrode 46 is directly deposited using a technique such as electron beam evaporation from the backside using the release silicon nitride structure as a masking layer. The bottom electrode 46 is coupled to the pads 18 through the buried metal trace 20. The mouse bite 50 may be formed as a result of the masking and etching techniques. An additional layer 44 may be formed as well on the bottom of the structure at the same time the bottom electrode 46 is formed.

Referring now to FIG. 19, in accordance with another embodiment of the present invention, a silicon over insulator (SOI) wafer may be covered with a dielectric layer 52 in accordance with one embodiment of the present invention. The dielectric layer 52 may be needed in some cases for isolation or the prevention of metal reaction with the SOI substrate. A metal layer is deposited and patterned for later bottom electrode contact to form the pad 54 and the connector 56. The dielectric layer 52 is patterned to open a window for single crystal piezoelectric film deposition and growth. The window reveals the underlying silicon layer 58.

As shown in FIG. 20, below the silicon layer 58 is a silicon dioxide layer 60 that in turn is positioned over a silicon substrate 62. In some embodiments a portion of the connector 56 steps down through the window onto the silicon layer 58 while the rest of the connector 56 and the pad 54 is positioned over the dielectric layer 52.

Figure 21:
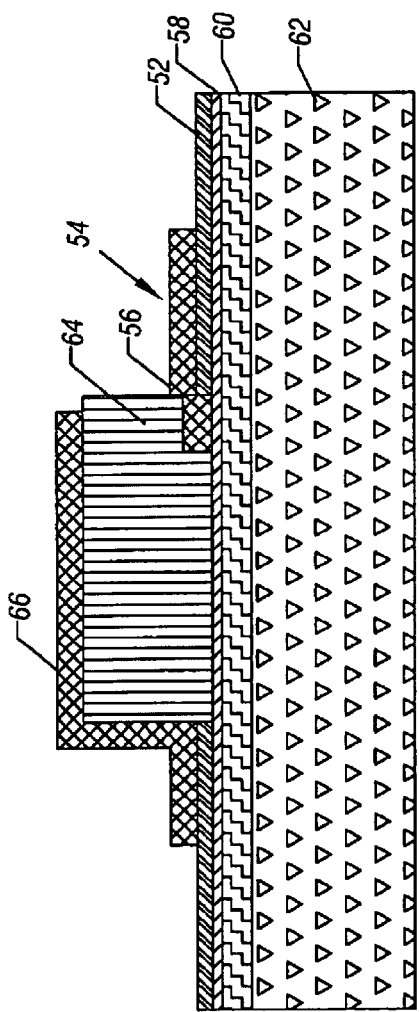
FIG. 21 is a cross-sectional view taken at a subsequent stage in accordance with one embodiment of the present invention.

Referring next to FIG. 21, a single crystal piezoelectric film 64 is deposited and patterned in the window over the silicon layer 58. A top electrode 66 is also deposited and patterned so as to extend over the piezoelectric film 64 and onto the dielectric layer 52.

Figure 22:
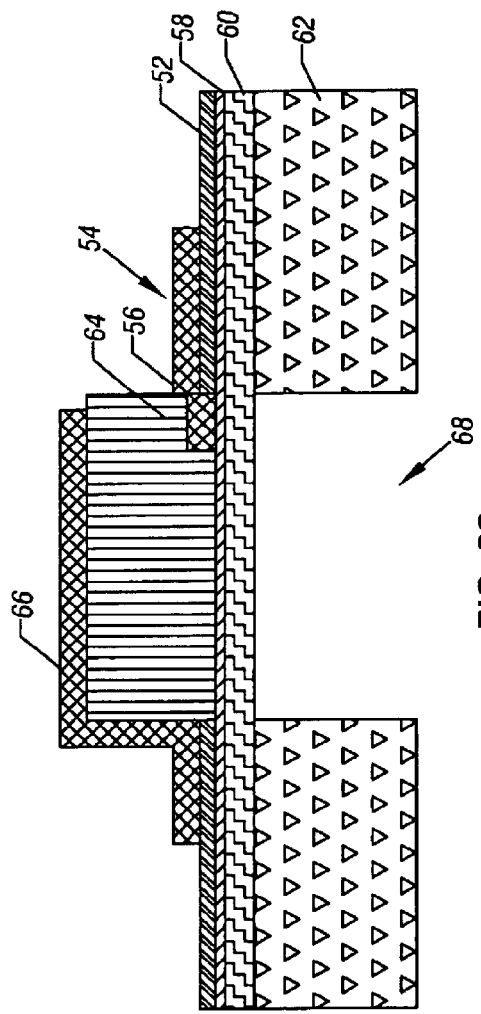
FIG. 22 is a cross-sectional view taken at a subsequent stage of the present invention.

Then, as shown in FIG. 22, the silicon substrate 62 under the active area is removed by DRIE or wet etch using the silicon dioxide layer 60 as an etch stop in some embodiments and forming the backside cavity 68.

Figure 23:
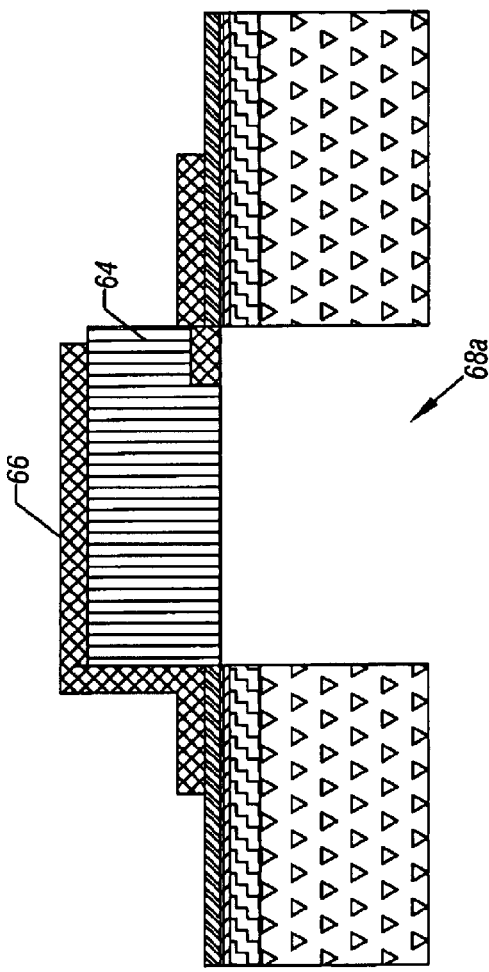
FIG. 23 is a cross-sectional view taken at a subsequent stage of the present invention.

Thereafter, the silicon dioxide layer 60 is etched through stopping at the silicon layer 58 and then the silicon layer 58 is etched through, stopping at the piezoelectric film 64 to form the modified cavity 68a as shown in FIG. 23. If the last silicon layer 52 is relatively thin, for example less than 0.1 micrometer, the etch stop at the piezoelectric film 64 can be precisely accomplished in some embodiments.

Figure 24:
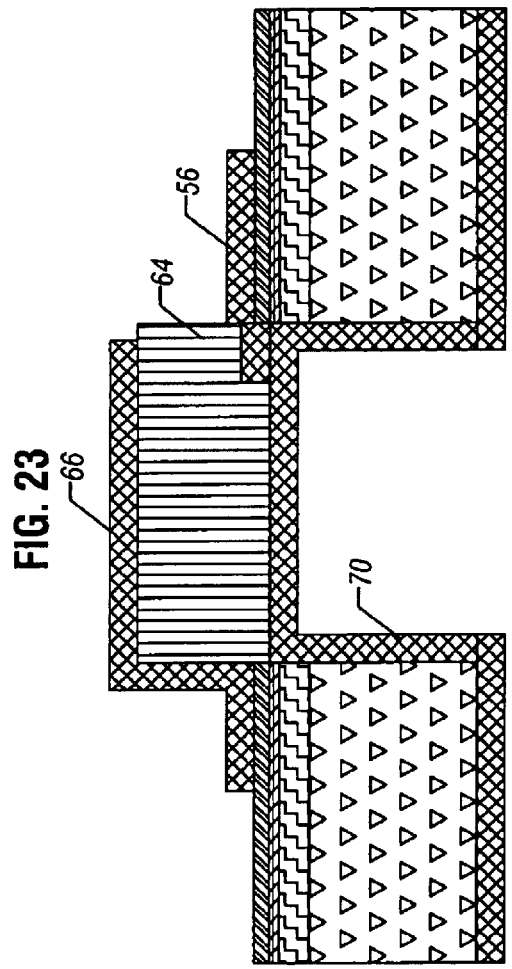
FIG. 24 is a cross-sectional view taken at a subsequent stage of the present invention.

Next, a bottom electrode 70 may be formed, for example, by sputter deposition as shown in FIG. 24. The bottom electrode 70 coats all the bottom surfaces, including the bottom surface of the silicon substrate 62, its sidewalls, and the bottom surface of the piezoelectric film 64.

Figure 25:
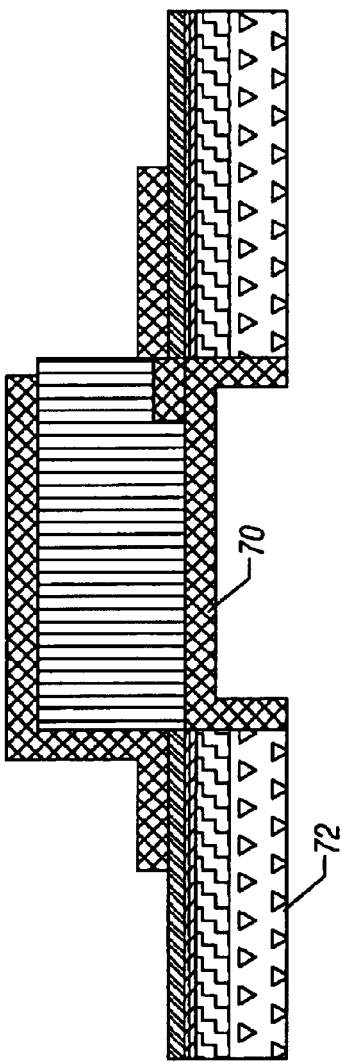
FIG. 25 is a cross-sectional view taken at a subsequent stage of the present invention.

The bottom surface of the wafer is then ground to reduce the thickness of the silicon substrate 72, as well as the extent of the bottom electrode 70, resulting in the structure shown in FIG. 25 with a u-shaped bottom electrode 70. The residual metal on the sidewall now covers only a small area and does not affect device operation.

Figure 26:
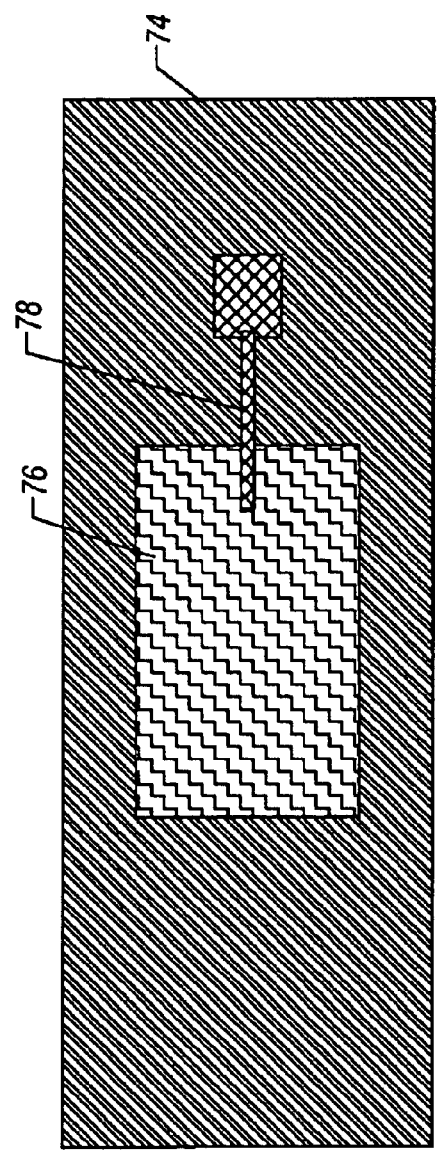
FIG. 26 is a top plan view at a subsequent stage in accordance with one embodiment of the present invention.

Referring next to FIG. 26, in accordance with still another embodiment of the present invention, a wafer with a thin highly doped layer 76 may be used. Therefore, the backside cavity etching can effectively stop at this highly doped layer if crystal orientation dependent etching, such as KOH, is used. The dielectric layer 74 may be needed in some cases for isolation or the prevention of metal reaction with the substrate. An electrode structure 78 may be formed over the dielectric layer 74, which has a rectangular window formed there through in one embodiment.

Figure 27:
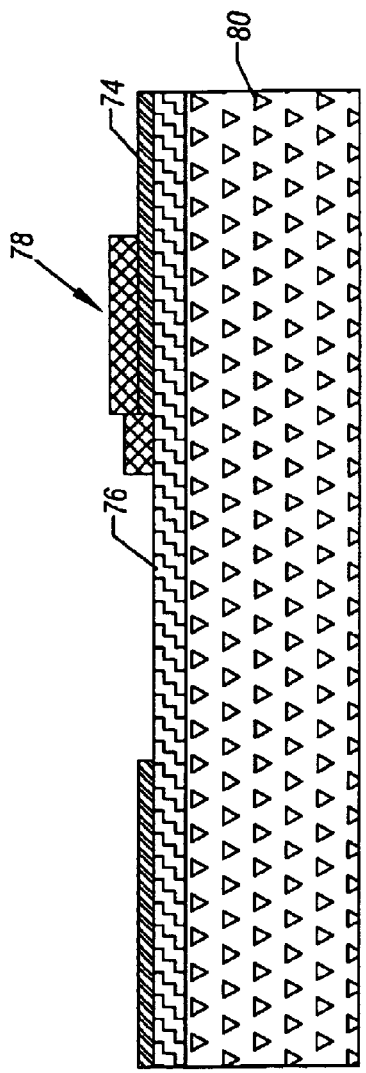
FIG. 27 is a central cross-sectional view taken through the embodiment shown in FIG. 26 in accordance with one embodiment of the present invention.

As shown in FIG. 27, a metal layer is deposited and patterned for later bottom electrode contact 78. The dielectric layer 74 is patterned to open a window for single crystal piezoelectric film deposition or growth. A silicon substrate 80 may be provided underneath the doped silicon layer 76. In some embodiments the doped silicon layer is highly doped with boron.

Figure 28:
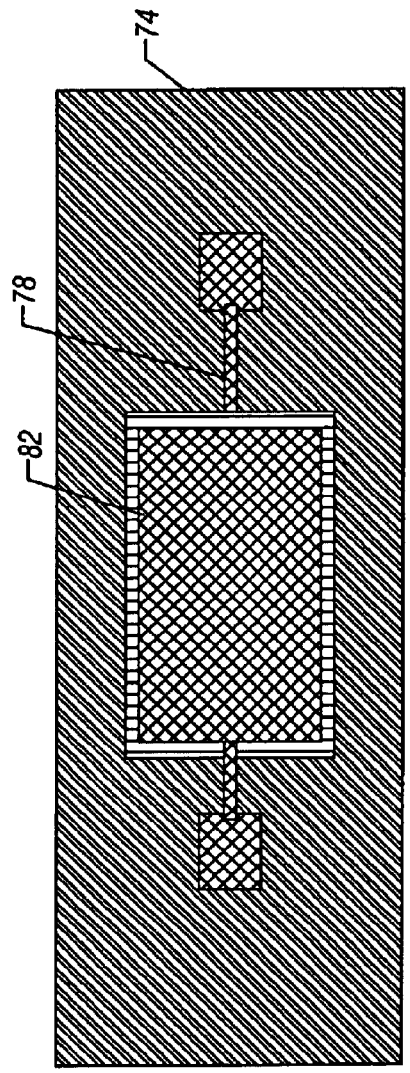
FIG. 28 is a top plan view at a subsequent stage in accordance with one embodiment of the present invention.
Figure 29:
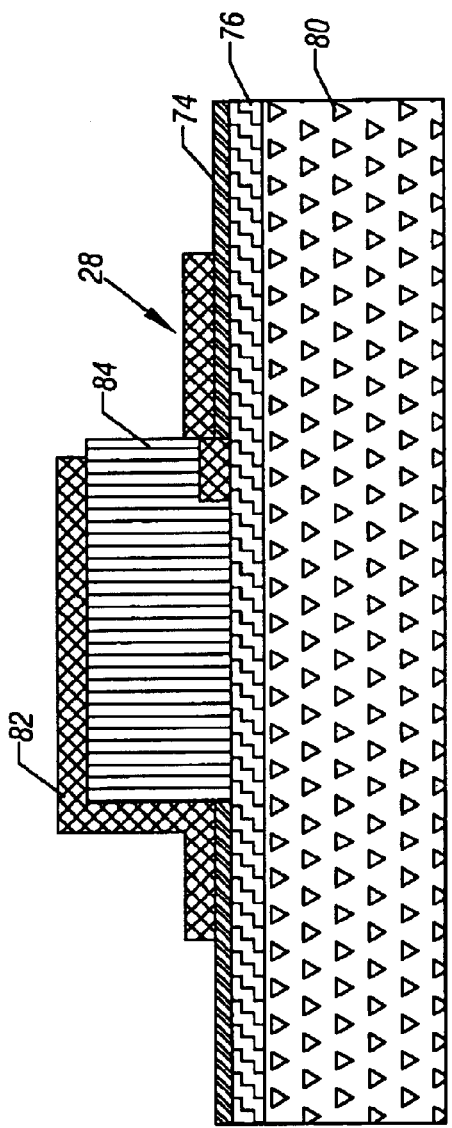
FIG. 29 is a central cross-sectional view taken through FIG. 28 in accordance with one embodiment of the present invention.

Moving to FIGS. 28 and 29, a single crystal piezoelectric film 84 is deposited and patterned on the highly doped layer 76. A top electrode 82 is deposited and patterned over the piezoelectric film 84 and the dielectric layer 74.

Figure 30:
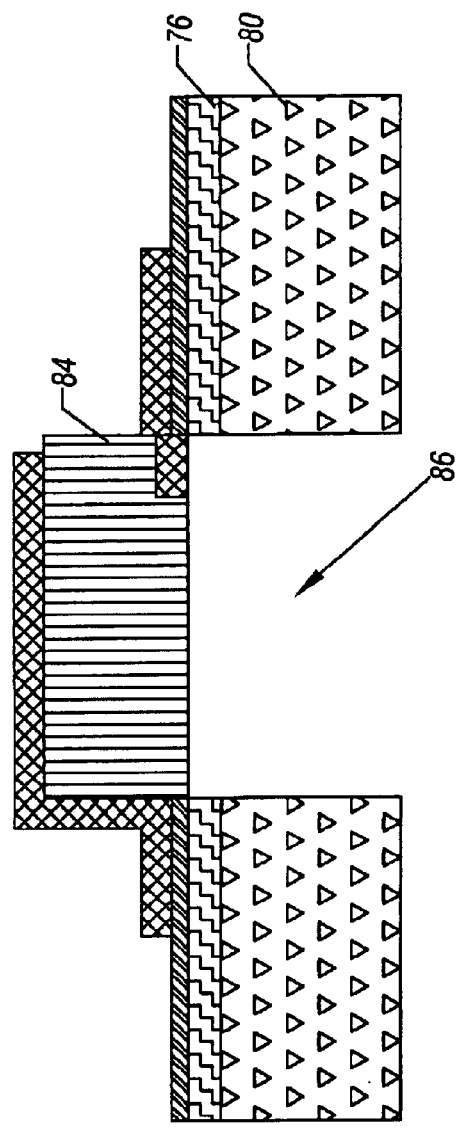
FIG. 30 is a cross-sectional view at a subsequent stage of the present invention in accordance with one embodiment.

Then, as shown in FIG. 30, the silicon substrate 80 under the active area may be removed by a electrochemical etch, such as KOH, using the highly doped silicon layer 76 as an etch stop. The highly doped silicon layer 76 is then etched using wet etching techniques, such as KOH, stopping at the piezoelectric film 84. If the last silicon layer is thin, for example less than one micron, the etch stop at the piezoelectric film 84 can be done precisely. That remaining thin layer may be the undoped silicon that is not doped in the course of ion implantation because the ion implantation extends a controlled distance into the substrate before it forms the doped layer 76. Because of the thinness of the layer, it was not shown in FIGS. 28 through 30. As a result, an opening 86 is formed through the silicon substrate 80 to the piezoelectric film 84.

Figure 31:
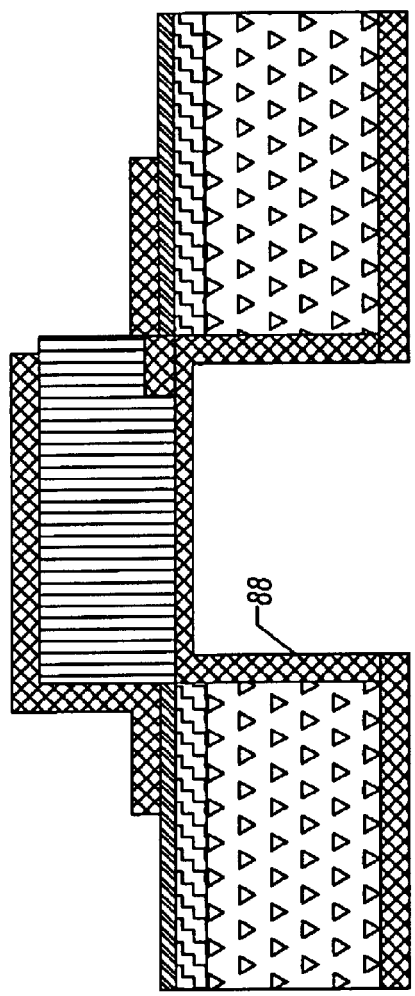
FIG. 31 is a cross-sectional view at a subsequent stage in accordance with one embodiment of the present invention.
Figure 32:
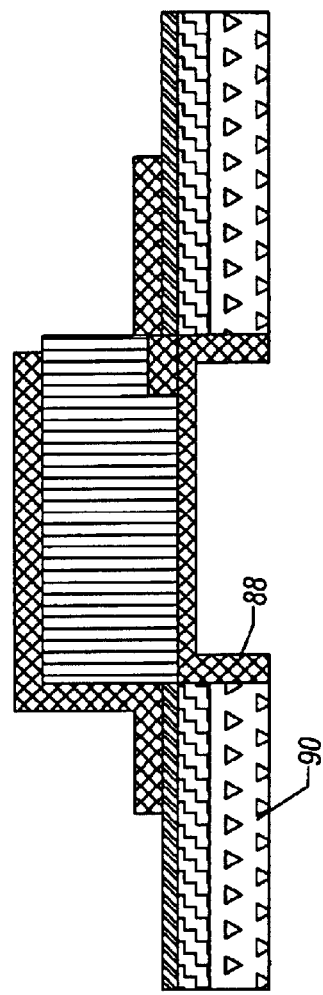
FIG. 32 is a cross-sectional view at a subsequent stage in accordance with one embodiment of the present invention.

Then, as shown in FIG. 31, the bottom electrode 88 may be formed, for example, by sputter deposition. As shown in FIG. 32, the lower surface of the wafer may be ground to remove the metal and to reduce the vertical extent of the lower electrode 88. Since the residual metal on the sidewall is covering a small area, it does not affect device operation.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a masking layer in a substrate;

depositing a piezoelectric film directly on said substrate;

removing at least a portion of said substrate underneath said piezoelectric film;

providing a lower electrode on said substrate; and forming an upper electrode of a film bulk acoustic resonator.

2. The method of claim 1 including using ion implantation to form said masking layer.

3. The method of claim 2 including etching said substrate to remove said substrate while leaving the masking layer.

4. The method of claim 3 including depositing said lower electrode in the region where said substrate was removed.

5. The method of claim 4 including using said masking layer as a mask to prevent deposition of said lower electrode over a portion of said film.

6. The method of claim 1 including removing all of the substrate under the piezoelectric film.

7. The method of claim 1 including depositing the piezoelectric film directly on the substrate.

8. The method of claim 1 including depositing the piezoelectric film directly on a silicon material over a substrate.

9. The method of claim 8 including depositing said piezoelectric film over a silicon over insulator wafer.

10. The method of claim 1 including forming a backside cavity by etching through said substrate.

11. The method of claim 10 including covering said cavity with a conductor to form said lower electrode.

12. The method of claim 11 including grinding said substrate and said conductor.

13. The method of claim 1 including forming a highly doped layer by ion implantation in a semiconductor substrate and depositing said piezoelectric film on said doped semiconductor substrate.

14. The method of claim 13 including forming said doped layer in said substrate between first and second substantially undoped layers of said substrate and forming a backside cavity through said substrate by etching said substantially first undoped layer and then etching said doped layer down to said second substantially undoped layer between the surface of said substrate and said doped layer.

15. The method of claim 14 including etching said second substantially undoped layer.

16. The method of claim 15 including forming said second substantially undoped layer to a thickness of approximately one micron or less.

17. The method of claim 1 including forming a relatively thin undoped silicon layer over a semiconductor substrate and depositing said piezoelectric film on said relatively thin undoped silicon layer.

18. The method of claim 17 including forming said thin undoped layer of a thickness of about one micron or less.

* * * * *